(12) United States Patent
Chen et al.

(10) Patent No.: US 7,368,229 B2
(45) Date of Patent: May 6, 2008

(54) COMPOSITE LAYER METHOD FOR MINIMIZING PED EFFECT

(75) Inventors: Chun-Lang Chen, Tainan County (TW); Fei-Gwo Tsai, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 583 days.

(21) Appl. No.: 10/835,218

(22) Filed: Apr. 28, 2004

(65) Prior Publication Data

US 2005/0244721 A1 Nov. 3, 2005

(51) Int. Cl.
*G03F 7/20* (2006.01)
*G03F 7/26* (2006.01)

(52) U.S. Cl. ...................... 430/322; 430/961
(58) Field of Classification Search ................ 430/322, 430/961
See application file for complete search history.

(56) References Cited

U.S. PATENT DOCUMENTS 6,107,006 A * 8/2000 Chang ......................... 430/322
2002/0090577 A1 * 7/2002 Asanuma ..................... 430/312
2004/0033670 A1 * 2/2004 Yang et al. .................. 438/305
2004/0048412 A1 * 3/2004 Nagai et al. ................... 438/99
2004/0265706 A1 * 12/2004 Montgomery et al. ......... 430/5

* cited by examiner

*Primary Examiner*—Mark F. Huff
*Assistant Examiner*—Brittany Raymond
(74) *Attorney, Agent, or Firm*—Tung & Associates

(57) ABSTRACT

A novel composite layer structure method which is suitable for reducing post-exposure delay (PED) effects associated with fabricating a photolithography reticle or mask and eliminating or at least minimizing variations between intended and realized critical dimension values for a circuit pattern fabricated on the reticle or mask. The method includes providing a mask blank having a metal layer, providing a photoresist layer on the metal layer of the mask blank, providing a protective layer on the photoresist layer and photo-cracking the photoresist layer in the desired circuit pattern typically by electron beam exposure. During subsequent post-exposure delay periods, the protective layer prevents or minimizes Q-time narrowing of the photo-cracked photoresist, and consequently, prevents or minimizes narrowing of the critical dimension of a circuit pattern etched in the metal layer according to the width of the photo-cracked photoresist.

22 Claims, 2 Drawing Sheets

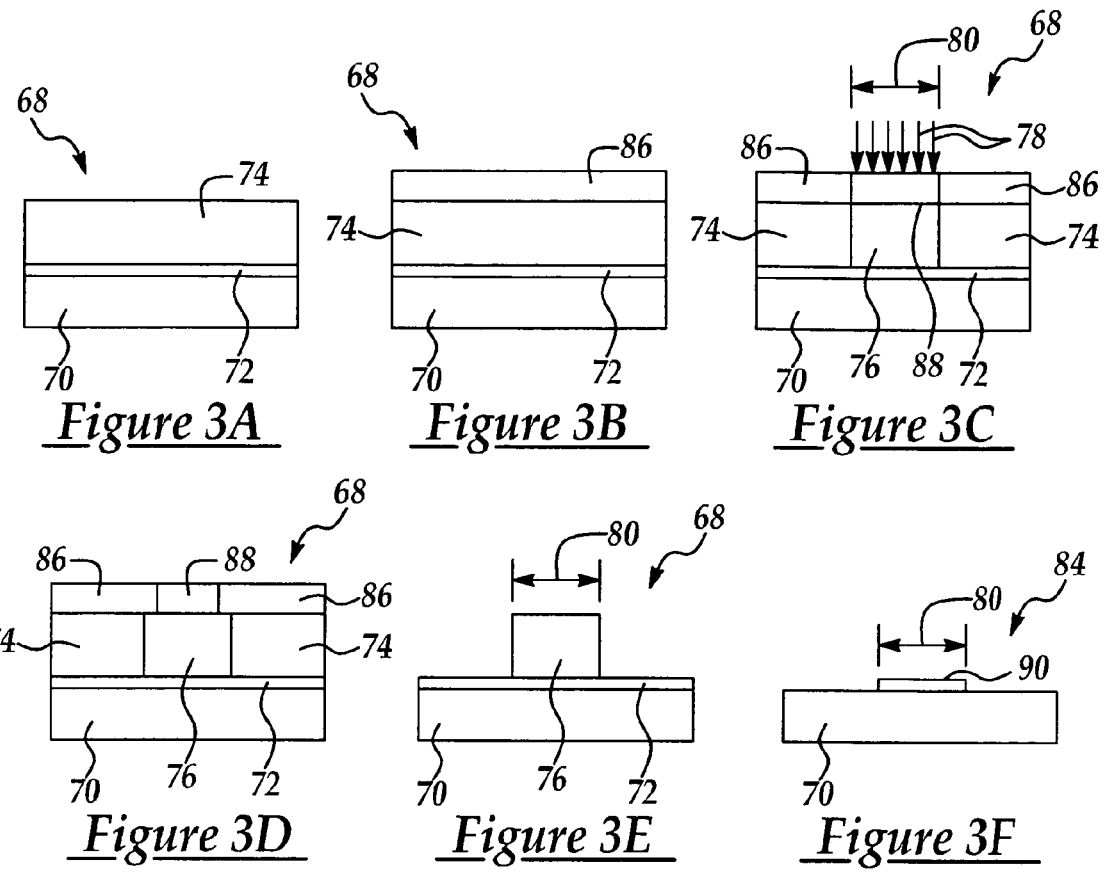
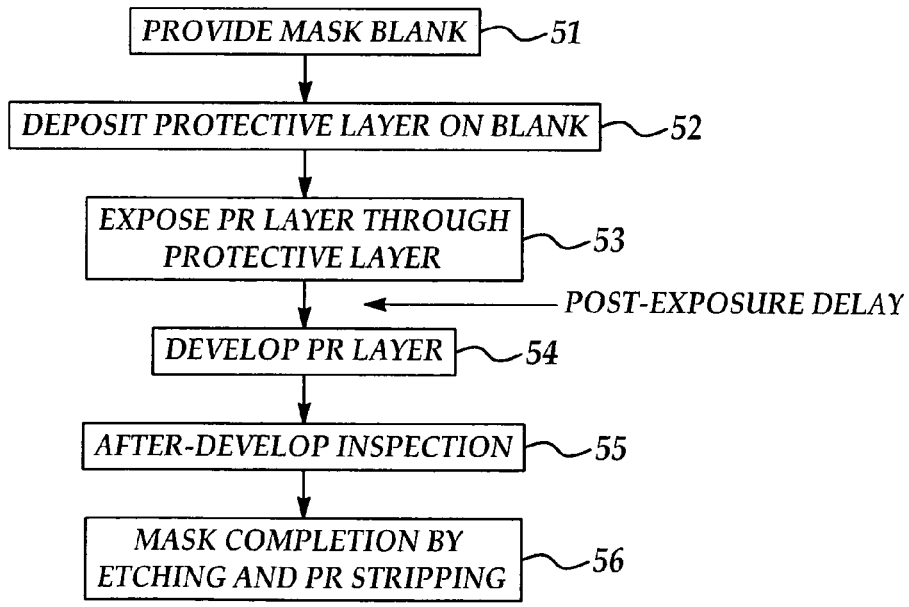

COMPOSITE LAYER METHOD FOR MINIMIZING PED EFFECT

FIELD OF THE INVENTION

The present invention relates to photolithography processes used in the formation of integrated circuit (IC) patterns on photoresist in the fabrication of semiconductor integrated circuits. More particularly, the present invention relates to a composite layer method which includes providing a protective layer on a photoresist layer to minimize post-exposure delay effects (PED) and facilitate more precise dimensional control over photoresist features and prolongation of Q-time in the fabrication of photolithography masks and reticles.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

Spin coating of photoresist on wafers, as well as the other steps in the photolithograpty process, is carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

During the photolithography step of semiconductor production, light energy is applied through a reticle mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

There are two basic types of photoresist: positive and negative. When positive photoresist is applied to a substrate, light energy ruptures bonds in the portion of the photoresist which covers the portion of the underlying metal to be removed by etching. Thus, the ruptured portions of the resist render the underlying metal vulnerable to etching while the portions which are not ruptured render the underlying metal resistant to etching. On the other hand, when negative photoresist is applied to a substrate, light energy cross-links the portion of the resist which is to mask or shield the underlying metal layer from etching. Thus, the portions of the resist which are not cross-linked render the underlying metal layer vulnerable to etching while the portions which are cross-linked render the underlying metal resistant to etching.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

A typical method of forming a circuit pattern on a wafer includes introducing the wafer into the automated track system and then spin-coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-sputtered quartz reticle. When properly aligned and focused, the stepper exposes a small area of the wafer, then shifts or "steps" to the next field and repeats the process until the entire wafer surface has been exposed to the die patterns on the reticle. The photoresist is exposed to light through the reticle in the circuit image pattern. Exposure of the photoresist to this image pattern cross-links and hardens the resist in the circuit pattern. After the aligning and exposing step, the wafer is exposed to post-exposure baking and then is developed and hard-baked to develop the photoresist pattern.

The circuit pattern defined by the developed and hardened photoresist is next transferred to the underlying metal conductive layer using a metal etching process, in which metal over the entire surface of the wafer and not covered by the photoresist with ruptured bonds is etched away from the wafer with the metal under the cross-linked photoresist that defines the circuit pattern protected from the etchant. As a result, a well-defined pattern of metallic microelectronic circuits which closely approximates the cross-linked photoresist circuit pattern remains in the metal layer.

Reticles and masks typically include a transparent substrate of silica glass or quartz on which is provided a thin chrome layer that is patterned to define the necessary design shapes of the circuitry for a particular layer on a wafer. The basic steps for forming or "writing" a circuit pattern on a mask or reticle are similar to the steps for transferring the circuit pattern photolithographically from the mask or reticle to the wafer and are summarized in FIGS. 1A-1D. As shown in FIG. 1A, a mask blank 8 includes a transparent substrate 10 which is silica glass or quartz, for example; a chrome layer 12 deposited on the substrate 10; and a positive photoresist 14 deposited on the chrome layer 12. As shown in FIG. 1B, a desired width of the photoresist 14 is subjected to an electron beam 18 to form photoresist 16 with ruptured bonds, the width of which corresponds to the critical dimension (CD) for the circuit pattern to be ultimately transferred to a wafer (not shown) using the mask 8. Eventually, as shown in FIG. 1D, the photoresist 16 with ruptured bonds and underlying portion of the chrome layer 12 is etched and the unexposed photoresist 14 is stripped to define a mask 24. A gap 26 which corresponds to the width of a device feature of the circuit pattern to be transferred to the wafer is thus etched in the chrome layer 12 of the mask 24. In subsequent photolithography steps, light energy is transmitted through the gap 26 and the transparent substrate 10 to a layer of photoresist (not shown) on the wafer to define the circuit pattern in the photoresist, with the areas of the photoresist which are exposed to the light energy through the gap 26 becoming cross-linked and the areas of the photoresist which are shielded by the chrome layer 12 remaining in the non cross-linked configuration.

After the photoresist 16 with ruptured bonds is formed on the substrate 10 and before the chrome layer 12 is etched, the mask blank 8 undergoes a post-exposure delay (PED) period, during which time the mask blank 8 is temporarily stored prior to photoresist development. As shown in FIG. 1C, during this waiting period, which is referred to as the "Q-time" and is typically about 2-24 hours, the photo-cracking photoresist 16 is exposed to atmospheric humidity and ammonium ($NH_4$) ions in the clean room storage environment. This causes the photo-cracking photoresist 16 to become un-cross-linked at the junction between the unexposed photoresist 14 and the exposed, photo-cracking photoresist 16. Accordingly, the photo-cracking photoresist 16 gradually narrows from an intended width 22 that corresponds to the intended critical dimension for the device features of the circuit pattern to be formed, to an actual width 20 which may be 28 nm narrower than the intended width 22. The area of photoresist which is sensitive to etching has the narrowed, actual width 20 rather than the original, intended width 22. When that occurs, the width of the gap 26 subsequently etched in the chrome layer 12 corresponds to the actual width 20 rather than the intended width 22, as shown in FIG. 1D. This adversely affects the dimensions of device features which are ultimately fabricated on the wafer based on the circuit pattern transferred to photoresist on the wafer using the fabricated mask 24. It has been found that the photo-cracking photoresist may narrow by as much as 28 nanometers over a 24-hour post-exposure delay period. Accordingly, a novel composite layer structure method is needed for the fabrication of a circuit pattern in a mask to minimize post-exposure delay (PED) effects of mask fabrication.

An object of the present invention is to provide a novel composite layer method suitable for reducing post-exposure delay (PED) effects associated with fabricating a photolithography reticle or mask.

Another object of the present invention is to provide a novel composite layer method suitable for preventing or minimizing variations between intended and realized critical dimension values of circuit pattern features fabricated on photolithography masks.

Still another object of the present invention is to provide a novel composite layer method which stabilizes photoresist sensitivity during post-exposure delay (PED) periods.

Yet another object of the present invention is to provide a novel composite layer method which widens the available process window between cross-linking a photoresist layer on a mask blank typically by electron beam exposure and etching a chromium layer to define a circuit pattern on the mask.

A still further object of the present invention is to provide a novel composite layer method which includes providing a photoresist layer on a chromium layer of a mask blank, providing a protective layer on the photoresist layer and exposing the protective layer and the photoresist layer to an electron beam to photo-crack the photoresist layer, such that the protective layer prevents Q-time narrowing of the photo-cracking photoresist during post-exposure delay periods.

Still another object of the present invention is to provide a photolithography mask which is fabricated by providing a mask blank having a transparent substrate and a chromium layer provided on the substrate, providing a photoresist layer on the chromium layer, providing a protective layer on the photoresist layer, defining a circuit pattern in the photoresist layer by photo-cracking the photoresist layer, and etching the chromium layer according to the cross-linked photoresist to define the circuit pattern in the chromium layer.

SUMMARY OF THE INVENTION

In accordance with these and other objects and advantages, the present invention is generally directed to a novel composite layer structure method which is suitable for reducing post-exposure delay (PED) effects associated with fabricating a photolithography reticle or mask and eliminating or at least minimizing variations between intended and realized critical dimension values for a circuit pattern fabricated on the reticle or mask. The method includes providing a mask blank having a metal layer, providing a photoresist layer on the metal layer of the mask blank, providing a protective layer on the photoresist layer and photo-cracking the photoresist layer in the desired circuit pattern typically by electron beam exposure. During subsequent post-exposure delay periods, the protective layer prevents or minimizes Q-time narrowing of the photo-cracked photoresist, and consequently, prevents or minimizes narrowing of the critical dimension of a circuit pattern etched in the metal layer according to the width of the photo-cracked photoresist.

BRIEF DESCRIPTION OF THE DRAWINGS

The invention will now be described, by way of example, with reference to the accompanying drawings, in which:

FIG. 3A is a cross-sectional view of a mask blank as a first step in implementation of a second embodiment of the method of the present invention;

FIG. 3B is a cross-sectional view illustrating a protective layer deposited on a negative photoresist layer of the mask blank of FIG. 2A as a second step according to the method of the present invention;

FIG. 3C is a cross-sectional view of the mask blank illustrating photo-cracking of the negative photoresist layer on the mask blank and of the protective layer as a third step according to the method of the present invention;

FIG. 3D is a cross-sectional view of the mask blank after a post-exposure baking process as a fourth step according to the method of the present invention;

FIG. 3E is a cross-sectional view of the mask blank after development of the photoresist layer on the mask;

FIG. 3F is a cross-sectional view of a photolithography mask fabricated according to the method of the present invention; and FIG. 4 is a flow diagram summarizing sequential process steps according to the method of the present invention.

DESCRIPTION OF THE PREFERRED EMBODIMENTS

When used herein, the term, "mask" shall be construed to mean a mask or reticle used to form circuit patterns on photoresist in the fabrication of semiconductor integrated circuits.

Unless otherwise specified, all structures, layers, processes, etc. may be formed or accomplished by conventional methods known by those of ordinary skill in the art.

The present invention is generally directed to a novel composite layer structure method which is particularly effective in eliminating or at least minimizing variations between intended and realized critical dimension values for a circuit pattern fabricated on a reticle or mask as a result of post-exposure delay (PED) effects associated with fabricating a photolithography reticle or mask. The method includes providing a mask blank having a typically metal blanket layer, providing a positive photoresist layer on the blanket layer of the mask blank, providing a protective layer on the photoresist layer, and photo-cracking the photoresist layer in the desired circuit pattern typically by electron beam exposure. The protective layer may be a layer of low-sensitivity negative photoresist. During subsequent post-exposure delay periods, the protective layer prevents or minimizes Q-time narrowing of the photo-cracked photoresist, and consequently, prevents or minimizes narrowing of the critical dimension of a circuit pattern etched in the blanket layer according to the width of the photo-cracked photoresist.

In another embodiment, the method includes providing a mask blank having a typically metal blanket layer, providing a negative photoresist layer on the blanket layer of the mask blank, providing a protective layer on the photoresist layer and photo-cracking the photoresist layer in the desired circuit pattern typically by electron beam exposure. The protective layer is typically a layer of low-sensitivity negative photoresist. The invention further includes a photolithography mask fabricated by providing a mask blank having a typically metal blanket layer, providing a photoresist layer on the blanket layer of the mask blank, providing a protective layer on the photoresist layer, photo-cracking the photoresist layer in the desired circuit pattern, and etching the blanket layer according the circuit pattern.

Figure 1A:
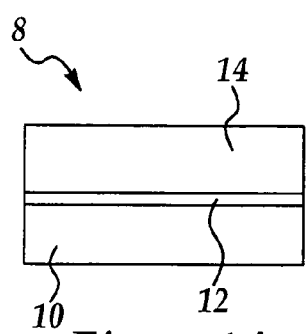
FIG. 1A is a cross-sectional view of a typical mask blank for fabrication of a photolithography mask according to conventional techniques.
Figure 1B:
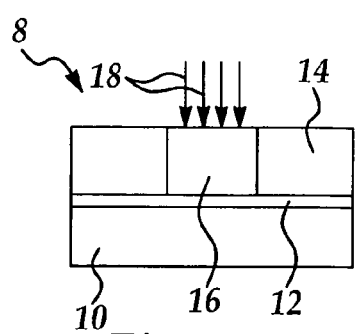
FIG. 1B is a cross-sectional view of the mask blank of FIG. 1, illustrating photo-cracking of a photoresist layer thereon according to conventional techniques.
Figure 1C:
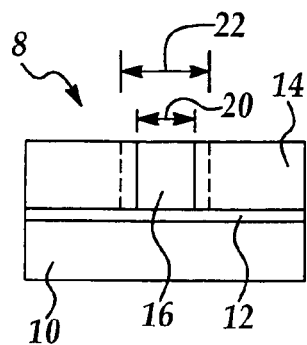
FIG. 1C is a cross-sectional view of the mask blank, illustrating narrowing of the photo-cracked photoresist during post-exposure delay periods of mask fabrication.
Figure 1D:
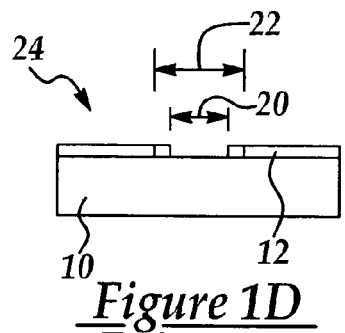
FIG. 1D is a cross-sectional view of a photolithography mask fabricated from the mask blank using the conventional process of FIGS. 1A-1C.
Figure 2A:
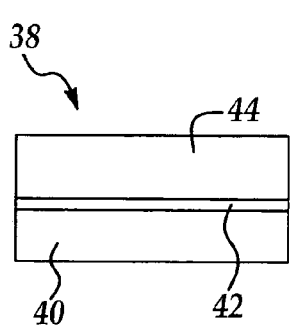
FIG. 2A is a cross-sectional view of a mask blank as a first step in implementation of a first embodiment of the method of the present invention.
Figure 2B:
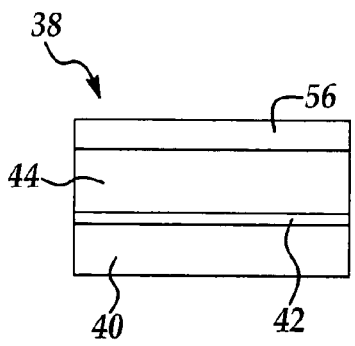
FIG. 2B is a cross-sectional view illustrating a protective layer deposited on a positive photoresist layer of the mask blank of FIG. 2A as a second step according to the method of the present invention.

Referring to FIGS. 2A-2F, in a first embodiment of the method according to the present invention, in a first step a mask blank 38 is obtained. The mask blank 38 includes a transparent substrate 40, such as quartz, and a typically metal blanket layer 42 such as chromium sputtered on the transparent substrate 40. The mask blank 38 may be conventional and is obtainable from the Hoya corp., for example. A layer of positive or negative photoresist 44, which may be multi-layered, is coated on the blanket layer 42. As shown in FIG. 2B, in a second step according to the method of the invention, a protective layer 56, which may be an organic positive or negative photoresist, is coated on the photoresist layer 44. The protective layer 56 may be a low-sensitivity negative-type chemical amplified resist (CAR) known by those skilled in the art. The mask blank 38 is then soft-baked at typically about 95 degrees C. for typically about 300 seconds to drive off solvent and harden the protective layer 56.

Figure 2C:
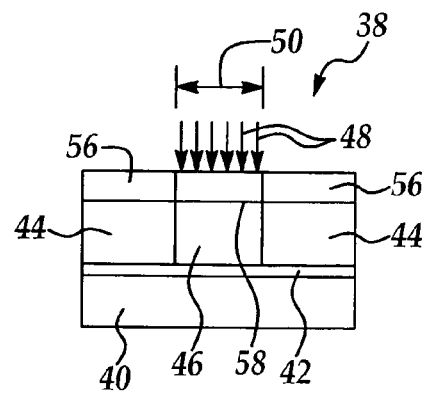
FIG. 2C is a cross-sectional view of the mask blank illustrating photo-cracking of the positive photoresist layer on the mask blank and of the protective layer as a third step according to the method of the present invention.

In a third step according to the method of the invention, shown in FIG. 2C, the photoresist layer 44 is photo-cracked in the configuration of the circuit pattern to be fabricated on the mask blank 38, by exposure of the photoresist layer 44 to an electron beam 48 through the protective layer 56. The exposure step may be carried out on a Hitachi exposure apparatus using an electron beam energy of typically about 50 KeV and an exposure energy of typically about 10 $\mu\text{-c/cm}^2$. The electron beam 48 penetrates the protective layer 56 and the underlying photoresist layer 44, defining an exposed protective layer 58 in the protective layer 56 and an underlying photo-cracked photoresist layer 46 in the unreacted photoresist layer 44. Both the exposed protective layer 58 and the photo-cracked photoresist layer 46 have a CD (critical dimension) width 50, such as 0.7 μm, which CD width 50 corresponds to the intended critical dimension width of the device features in the circuit pattern to the fabricated on the mask blank 38. Because the protective layer 56 is typically a low-sensitivity negative photoresist, the exposed protective layer 58 typically remains unreacted and is not photo-cracked while the underlying photo-cracked photoresist 46 is photo-cracked during the exposure step.

Figure 2D:
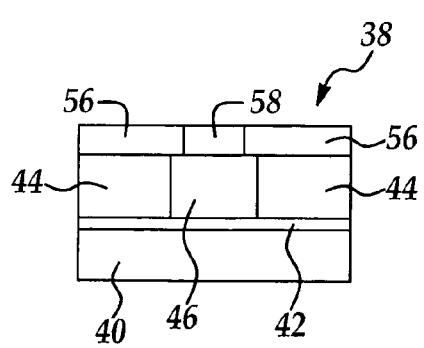
FIG. 2D is a cross-sectional view of the mask blank after a post-exposure baking process as a fourth step according to the method of the present invention.
Figure 2E:
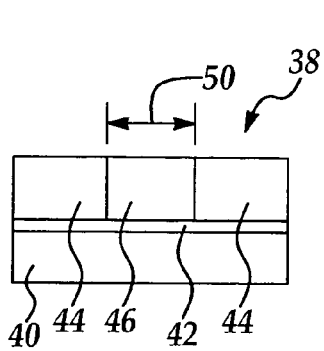
FIG. 2E is a cross-sectional view of the mask blank after development of the photoresist layer on the mask.

As shown in FIG. 2D, in a fourth step according to the method of the invention, the mask blank 38 is subjected to post-exposure soft-baking, followed by photoresist development. During the photoresist development stage, the mask blank 38 may be subjected to an acid-base neutralization reaction to remove the unreacted protective layer 56 and exposed protective layer 58 from the underlying photoresist layer 44 and photo-cracked photoresist 46, respectively, as shown in FIG. 2E. Between the post-exposure bake step of FIG. 2D and the photoresist development step of FIG. 2E, the mask blank 38 is typically subjected to a post-exposure delay (PED) period of typically about 2-24 hours. It will be appreciated by those skilled in the art that the protective layer 56 shields or protects the underlying photoresist layer 44 from atmospheric humidity and ammonium ions in the temporary storage environment in which the mask blank 38 is held prior to the photoresist development step. Thus, the photo-cracked photoresist layer 46 which remains after the development step has a width which substantially equals the CD width 50, as shown in FIG. 2E, as revealed by ADI (after-development inspection). It will be appreciated by those skilled in the art that due to the shielding effects of the protective layer 56, the width of the photo-cracked photoresist layer 46 changes by as little as 7 nanometers during the post-exposure delay period.

Figure 2F:
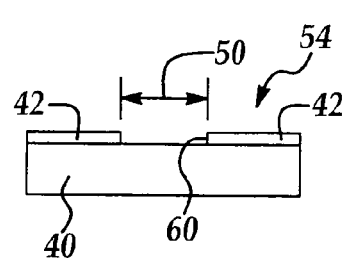
FIG. 2F is a cross-sectional view of a photolithography mask fabricated according to the method of the present invention.

As shown in FIG. 2F, a mask 54 is ultimately fabricated from the mask blank 38 by etching a gap 60 which corresponds in width to the CD width 50 in the blanket layer 42 and stripping the unreacted photoresist 44 from the substrate 40. During etching, the photo-cracked photoresist 46 is removed along with the underlying portion of the blanket layer 42 to define the gap 60, whereas the unreacted photoresist 44 shields the remaining portion of the blanket layer 42 from the etchant. The mask 54 is then used according to conventional photolithography techniques to form a circuit pattern on a layer of photoresist (not shown) coated on a wafer (not shown), by exposing the photoresist through the gap 60 in the mask 54.

Referring next to FIGS. 3A-3F, in a second embodiment of the method according to the present invention, as a first step a mask blank 68 is obtained. The mask blank 68 includes a blanket layer 72 such as chromium which is sputtered on a transparent substrate 70, such as quartz. A layer of positive or negative photoresist 74 is provided on the blanket layer 72 of the mask blank 68. As shown in FIG. 3B, in a second step according to the method of the invention, a protective layer 86, which may be an organic positive or negative photoresist, is deposited on the negative photoresist layer 74. The protective layer 86 is typically a low-sensitivity negative-type chemical amplified resist (CAR) known by those skilled in the art. The mask blank 68 is then soft-baked at typically about 95 degrees C. for typically about 300 seconds to drive off solvent and harden the protective layer 86.

In a third step according to the method of the invention, shown in FIG. 3C, the photoresist layer 74 is photo-cracked in the configuration of the circuit pattern to be fabricated on the mask blank 68, by exposure to an electron beam 78 through the protective layer 86. The exposure step may be carried out on a Hitachi exposure apparatus using an electron beam energy of typically about 50 KeV and an exposure energy of typically at least about 15 µ-c/cm². The electron beam 78 penetrates the protective layer 86 and the underlying photoresist layer 74, defining an exposed protective layer 88 and an underlying photo-cracked photoresist layer 76. The low-sensitivity exposed protective layer 88 typically remains unreacted. The photo-cracked photoresist layer 76 has a CD (critical dimension) width 80, such as 0.7 µm, which CD width 80 corresponds to the intended critical dimension width of the device features in the circuit pattern to the fabricated on the mask blank 68.

In a fourth step according to the method of the invention shown in FIG. 3D, the mask blank 68 is subjected to post-exposure soft-baking, followed by photoresist development. During the photoresist development stage, the mask blank 68 may be subjected to an acid base neutralization reaction to remove the protective layer 86 and unreacted exposed protective layer 88 from the underlying unreacted photoresist layer 74 and photocracked photoresist layer 76, as shown in FIG. 3E. The unreacted negative photoresist 74 is also removed from the blanket layer 72 during the photoresist development step.

Between the post-exposure bake step of FIG. 3D and the photoresist development step of FIG. 3E, the mask blank 68 is subjected to a post-exposure delay (PED) period of typically about 2-24 hours. Accordingly, the protective layer 86 shields or protects the underlying photo-cracked photoresist layer 76 from atmospheric humidity and ammonium ions in the storage environment. Thus, the photo-cracked photoresist layer 76 which remains after the development step has a width which substantially equals the CD width 80, as shown in FIG. 3E, as revealed by ADI (after-development inspection).

As shown in FIG. 3F, a mask 84 is ultimately fabricated from the mask blank 68 by etching the portions of the blanket layer 72 which remain unexposed by the photo-cracked photoresist 76 after the development step. Accordingly, a metal line segment 90 which corresponds in width to the CD width 80 in the blanket layer 72 remains shielded by the photo-cracked photoresist 76 during the etching process and remains on the substrate 70 after stripping of the photo-cracked photoresist 76 from the substrate 70. The mask 84 is then used according to conventional photolithography techniques to form a circuit pattern on a layer of photoresist (not shown) deposited on a wafer (not shown), by exposing the photoresist through the portions of the transparent substrate 70 which remain uncovered by the blanket layer segment 90 in the mask 84.

FIG. 4 summarizes summarizes a typical flow of process steps according to the methods of the present invention. In process step S1, a mask blank having a transparent substrate, a blanket layer and a photoresist layer is provided. In process step S2, a protective layer is coated on the photoresist layer of the mask blank. In process step S3, the photoresist layer is exposed through the protective layer to define a photo-cracked photoresist layer which corresponds in width to the desired critical dimension of device features to be fabricated on the mask blank. After this step, the mask blank typically undergoes a post-exposure delay period prior to development of the photoresist. In process step S4, the photoresist layer on the mask blank is developed. In process step S5, the photo-cracked photoresist is subjected to ADI (after-development inspection). In process step S6, fabrication of a mask from the mask blank is completed by etching the blanket layer and stripping remaining photoresist from the mask blank.

While the preferred embodiments of the invention have been described above, it will be recognized and understood that various modifications can be made in the invention and the appended claims are intended to cover all such modifications which may fall within the spirit and scope of the invention.

What is claimed is:

1. A method of minimizing narrowing of a circuit feature during post-exposure delay, comprising the steps of:
   providing a mask blank having a substrate, a blanket layer provided on said substrate and a first photoresist layer on said first blanket layer;

providing a protective layer on said first photoresist layer, wherein said protective layer comprises a second photoresist layer; and directing an energy source through said protective layer to said first photoresist layer to accomplish exposure while maintaining said protective layer in a substantially unreacted state to define the circuit feature in said first photoresist layer.

2. The method of claim 1 wherein said protective layer is a negative photoresist layer.

3. The method of claim 1 wherein said protective layer is a positive photoresist layer.

4. The method of claim 1 wherein said first photoresist layer is a negative photoresist layer.

5. The method of claim 1 wherein said first photoresist layer is a positive photoresist layer.

6. The method of claim 1 wherein said energy source is an electron beam.

7. The method of claim 1 further comprising the step of developing said protective layer and said first photoresist layer to remove said protective layer and a portion of said first photoresist layer to form an etching mask for etching said circuit feature.

8. The method of claim 1 wherein said first photoresist layer is multi-layered.

9. The method of claim 1 wherein said second photoresist layer comprises a negative chemical amplified resist and said first photoresist layer comprises a positive chemical amplified resist.

10. The method of claim 1 wherein said second photoresist layer is a negative photoresist layer and said first photoresist layer comprises a positive photoresist layer.

11. The method of claim 10 wherein at least one of said second photoresist layer and said first photoresist layer comprises a chemical amplified resist.

12. A method of minimizing narrowing of a circuit feature during post-exposure delay, comprising the steps of:

providing a mask blank having a substrate, a chromium layer provided over said quartz substrate and a first photoresist layer over said chromium layer;

providing a first layer protective layer on said photoresist layer, wherein said protective layer comprises a second photoresist layer, said protective layer substantially unreactive to an exposure energy source; and defining the circuit feature in said first photoresist layer by directing said exposure energy source through said protective layer to said first photoresist layer to accomplish exposure.

13. The method of claim 12 wherein said second photoresist layer is a negative photoresist layer and said first photoresist layer comprises a positive photoresist layer.

14. The method of claim 12 wherein said second photoresist layer is a negative photoresist layer and said first photoresist layer comprises a negative photoresist layer.

15. The method of claim 12 further comprising the step of developing said protective layer and said first photoresist layer to remove said protective layer and portion of said first photoresist layer to form an etching mask to etch said circuit feature.

16. The method of claim 12 wherein said first photoresist layer is multi-layered.

17. The method of claim 1, further comprising the step of temporarily storing said mask blank following said exposure prior to development.

18. The method of claim 12, further comprising the step of temporarily storing said mask blank following said exposure prior to development.

19. A method of minimizing narrowing of a circuit feature during post-exposure delay, comprising the steps of:

providing a mask blank having a substrate, a blanket layer provided over said substrate and a first photoresist layer over said blanket layer;

providing a protective layer over said first photoresist layer, said protective layer comprising a second photoresist layer substantially unreactive to an exposure energy source;

defining the circuit feature in said first photoresist layer by directing said exposure energy source through said protective layer to said photoresist layer to accomplish exposure;

temporarily storing said mask blank following said exposure; and, developing said mask blank following said temporary storage to remove said protective layer and a portion of said first photoresist layer to form an etching mask to etch said circuit feature.

20. The method of claim 19 wherein said second photoresist layer is a negative photoresist layer and said first photoresist layer comprises a positive photoresist layer.

21. The method of claim 19 wherein said second photoresist layer is a negative photoresist layer and said first photoresist layer comprises a negative photoresist layer.

22. The method of claim 19 wherein said energy source is an electron beam.

* * * * *